US008133773B2

(12) United States Patent
Shih et al.

(10) Patent No.: US 8,133,773 B2
(45) Date of Patent: Mar. 13, 2012

(54) APPARATUS AND METHOD FOR REDUCING PHOTO LEAKAGE CURRENT FOR TFT LCD

(75) Inventors: Ching-Chieh Shih, Hsinchu (TW);
Yeong-Shyang Lee, Hsinchu (TW);
Tsung-Yi Hsu, Hsinchu (TW);
Feng-Yuan Gan, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 534 days.

(21) Appl. No.: 11/873,674

(22) Filed: Oct. 17, 2007

(65) Prior Publication Data

US 2009/0101913 A1    Apr. 23, 2009

(51) Int. Cl.
*H01L 21/00* (2006.01)
*H01L 21/84* (2006.01)
*H01L 29/66* (2006.01)
(52) U.S. Cl. .. 438/158; 438/459; 257/409; 257/E21.414
(58) Field of Classification Search .................. 438/158, 438/159; 257/409, E21.414
See application file for complete search history.

(56) References Cited

U.S. PATENT DOCUMENTS

| 6,479,398 | B1 | 11/2002 | Chen et al. |
| 6,509,614 | B1 | 1/2003 | Shih |
| 7,005,332 | B2 | 2/2006 | Wu et al. |
| 7,094,656 | B2 | 8/2006 | Chen et al. |
| 2004/0066472 | A1* | 4/2004 | Lim ................ 349/43 |
| 2005/0134757 | A1 | 6/2005 | Kim et al. |
| 2005/0221546 | A1* | 10/2005 | Lee et al. ........ 438/158 |

FOREIGN PATENT DOCUMENTS

CN          1414422 A     4/2003
* cited by examiner

*Primary Examiner* — Matthew Landau
*Assistant Examiner* — Daniel Luke
(74) *Attorney, Agent, or Firm* — Morris Manning & Martin LLP; Tim Tingkang Xia, Esq.

(57) ABSTRACT

In one aspect of the invention, the method of forming a TFT array panel includes forming a patterned first conductive layer on a substrate, forming a gate insulating layer on the patterned first conductive layer and the substrate, forming a patterned semiconductor layer on the gate insulating layer, forming a patterned second conductive layer, forming a patterned passivation layer on the patterned second conductive layer and the substrate, and forming a patterned transparent conductive layer on the patterned passivation layer.

14 Claims, 17 Drawing Sheets

US 8,133,773 B2

APPARATUS AND METHOD FOR REDUCING PHOTO LEAKAGE CURRENT FOR TFT LCD

FIELD OF THE INVENTION

The present invention relates generally to an apparatus and a method for reducing photo leakage current for TFT liquid crystal display.

BACKGROUND OF THE INVENTION

Electronic matrix arrays are usually used in devices such as liquid crystal displays (LCD). Such devices are typically arranged in row and column address lines. These lines are horizontally and vertically spaced apart and cross at an angle to one another and a plurality of crossover points are formed. Each crossover point is associated with a corresponding display element to be selectively addressed. The display element may be a pixel of an imager array, or alternatively a pixel of an LCD. A switching or isolation device such as a thin film transistor (TFT) is associated with each display element allowing individual pixels in the LCD to be selectively addressed.

Structurally, these TFTs typically include a source electrode, a drain electrode, and a gate electrode, with a thin film of semiconductor material (e.g. amorphous silicon or a-Si) disposed between the source and drain electrodes. The gate electrode in proximity to the semiconductor but electrically insulated by a gate insulator. Current flow through the TFT between the source and drain electrodes is controlled by the application of voltage to the gate electrode. The application of a positive voltage (e.g. +10 volts) to the gate of the TFT forms a conducting channel and allows current to flow between the source and drain electrodes of the TFT.

The drain electrode of a TFT is usually in electrical communication with a pixel electrode. Thus, the source electrode of the TFT is usually in electrical communication with an image signal input. In an LCD applications for example, when a voltage (e.g. +10 volts) is applied to the gate and at the same time a video voltage (e.g. +5 volts) is applied through the image signal input to the source of a TFT, a conductive channel is formed in the semiconductor layer and current flows through from the drain electrode to the source electrode. This current charges the corresponding pixel electrode of the LCD causing the pixel to be in an "on-state." In LCD applications, the drain typically reaches a voltage similar to that is supplied to the source through the image signal input in the on-state. The amplitude of the voltage applied to the source through the image signal input thus determines how much voltage will be applied across the liquid crystal material in a given pixel and thus controls gray scale levels of the display. When voltage is no longer applied to the gate, the pixel stops charging but remains on until the next frame.

Conventionally, the TFT is made of an "island out" structure 200 as illustrated in FIGS. 5A, 5B and 5C. This structure is directly responsible for the generation of the undesirable leak photo current that reduces the performance of the TFT LCDs. FIG. 5A shows a top view and FIG. 5B shows a sectional view of the "island out" TFT structure 200. As illustrated in FIG. 5B, a gate electrode metal portion 210 is formed on a substrate 205. A gate insulation layer 212 is formed on the gate electrode metal portion 210. Additionally, a layer of intrinsic semiconductor 214 and a layer of doped semiconductor 216 are formed on the gate insulation layer 212. Moreover, a conductive layer 218 for source electrode 202 and drain electrode 204 covers the layer of intrinsic semiconductor 214 and the layer of doped semiconductor 216. FIG. 5C shows a detailed sectional view of an "island out" TFT structure 200 along the B-B' plane as shown in FIG. 5A. A passivation layer 220 and a transparent conductive layer (i.e. indium, tin oxide, or ITO) 222 are formed on top of the TFT structure surface shown in FIG. 5B.

As it is known to those skilled in the art, one of the characteristics of the semiconductor amorphous silicon using the "island out" TFT structure is that the amorphous silicon produces "photo current" (i.e. a leakage current from the source to the drain through the semiconductor layer when the pixel is in an on-state) under normal or strong lighting. Accordingly, a TFT's photo leakage current is a critical element determining the overall image quality of LCDs. It is well known that high TFT leakage current degrades performance of an LCD display. The adverse effects include inconsistent/non-uniform gray scales, crosstalk, shading, flicker, and/or image sticking. This leakage current is an undesirable and unintentional characteristics associated with conventional TFT made of semiconductor materials such as amorphous silicon or a-Si and using the "island out" TFT structure.

Various attempts have been made to minimize TFT leakage current. For example, for crystalline-silicon and polycrystalline silicon TFTs, lightly doped drain or drain offset structures have been experimented. However, that approach requires additional process steps (i.e. photo, ion implantation, etc.). An alternative is to use an "island in" TFT structure 300 as illustrated in FIGS. 6A and 6B. FIG. 6A shows a top view and FIG. 6B shows a sectional view of the "island in" TFT structure 300. A gate electrode metal portion 310 is formed on a substrate 305. Additionally, a gate insulation layer 312 is formed on the gate electrode metal portion 310. A layer of intrinsic semiconductor 314 and a layer of doped semiconductor 316 are formed on the gate insulation layer 312. As shown in FIG. 6B, the layer of intrinsic semiconductor 314 and the layer of doped semiconductor 316 are rather narrow in comparison with the corresponding counterparts of the "island out" TFT structure shown in FIG. 5B. A conductive layer 318 for source electrode 302 and drain electrode 304 covers the layer of intrinsic semiconductor 314 and the layer of doped semiconductor 316. Since the size of the intrinsic semiconductor (amorphous silicon) is reduced, the amorphous silicon's exposure to the light is greatly reduced. Therefore, the photo leakage current is reduced as well.

Although the "island in" TFT structure reduces the photo leakage current, it requires additional mask, photolithographic and etching processes, which makes it undesirable for mass production. In order to consolidate the processing steps in mass production, normally intrinsic amorphous silicon and the source and drain electrode metal are deposited on the gate insulation layer at the same time. This process dictates that a TFT made by this process must use the "island out" TFT structure.

Therefore, a heretofore unaddressed need exists in the art to address the aforementioned deficiencies and inadequacies, which is to find a new TFT structure and a method for making the same with reduced leakage current in the TFT and without additional TFT manufacturing and/or processing steps.

SUMMARY OF THE INVENTION

The present invention, in one aspect, relates to a method of forming a thin film transistor (TFT) array panel. In one embodiment, the method includes the steps of: (i) forming a patterned first conductive layer, which includes a gate line and a shielding portion, on a substrate, (ii) forming a gate insulating layer on the patterned first conductive layer and the substrate, (iii) forming a patterned semiconductor layer on the gate insulating layer, (iv) forming a patterned second conductive layer, which includes a source electrode and a drain electrode, on the patterned semiconductor layer, and a data line that is electrically connected to the source electrode, (v) forming a patterned passivation layer on the patterned second conductive layer and the substrate, and (vi) forming a patterned transparent conductive layer on the passivation layer. In one embodiment, the step of forming the patterned first conductive layer further includes the step of forming a gap between the gate line and the shielding portion. The width of the gap is less than 6 µm. In another embodiment, the step of forming the patterned first conductive layer further includes forming a shielding line, disposed under the data line.

In one embodiment, the step of forming the patterned first conductive layer includes the steps of: (i) forming a first conductive layer on the substrate, (ii) forming a first photo-resist pattern on the first conductive layer, (iii) etching the first conductive layer by using the first photo-resist pattern as a mask to form the gate line and the shielding portion adjacent to the gate line on the substrate, and (iv) removing the first photo-resist pattern.

In one embodiment, the step of forming the patterned semiconductor layer includes the step of: (i) forming an intrinsic semiconductor layer on the gate insulating layer, (ii) forming a doped semiconductor layer on the intrinsic semiconductor layer, (iii) forming a second photo-resist pattern on the doped semiconductor layer, (iv) etching the intrinsic semiconductor layer and the doped semiconductor layer by using the second photo-resist pattern as a mask to form the patterned semiconductor layer on the gate insulating layer over the gate line and the shielding portion, and (v) removing the second photo-resist pattern.

In one embodiment, the step of forming the patterned second conductive layer includes the steps of: (i) forming a second conductive layer on the doped semiconductor layer and the gate insulating layer, (ii) forming a third photo-resist pattern on the second conductive layer, (iii) etching the second conductive layer by using the third photo-resist pattern as a mask to form the source electrode and the drain electrode on the doped semiconductor layer, and the data line on the gate insulating layer, and (iv) removing the third photo-resist pattern.

In one embodiment, the step of forming the patterned passivation layer includes the steps of: (i) forming a passivation layer on the patterned second conductive layer and the substrate, (ii) forming a fourth photo-resist pattern on the passivation layer, (iii) etching the passivation layer by using the fourth photo-resist pattern as a mask to form a contact hole exposing a portion of the drain electrode, and (iv) removing the fourth photo-resist layer pattern.

In one embodiment, the step of forming the patterned transparent conductive layer includes the step of: (i) forming a transparent conductive layer on the patterned passivation layer, (ii) forming a fifth photo-resist pattern on the transparent conductive layer, (iii) etching the transparent conductive layer by using the fifth photo-resist pattern as a mask to form the patterned transparent conductive layer electrically connected to the drain electrode through the contact hole, and (iv) removing the fifth photo-resist pattern.

In one embodiment, the steps of forming the patterned semiconductor layer, and forming the patterned second conductive layer are performed by using a half-tone mask or a gray-tone mask.

In one embodiment, the steps of forming the patterned semiconductor layer, and forming the patterned second conductive layer include the steps of: (i) forming an intrinsic semiconductor layer on the gate insulating layer, (ii) forming a doped semiconductor layer on the intrinsic semiconductor layer, (iii) forming a second conductive layer on the doped semiconductor layer, (iv) forming a sixth photo-resist pattern by using the half-tone mask or the gray-tone mask, on the second conductive layer, (v) etching the intrinsic semiconductor layer, the doped semiconductor layer, and the second conductive layer by using the sixth photo-resist pattern as a mask to form the patterned semiconductor layer, and the patterned second conductive layer on the patterned semiconductor layer, and (vi) removing the sixth photo-resist pattern.

In one embodiment, the method further includes the step of forming a storage capacitor between the gate line and the patterned transparent conductive layer. The shielding portion is formed to have a width that is at least equal to the width of the source electrode. In another aspect, the present invention includes a thin film transistor (TFT) array panel for a liquid crystal display device. In one embodiment, the thin film transistor (TFT) array panel has: (i) a substrate, (ii) a patterned first conductive layer having a gate line, a gate electrode, and a shielding portion that is adjacent to the gate line, all formed on the substrate, (iii) a gate insulating layer formed on the first patterned conductive layer, (iv) a patterned semiconductor layer formed on the gate insulating layer over the gate electrode and the shielding portion, (v) a second conductive layer having a source electrode and a drain electrode disposed on the patterned semiconductor layer, (vi) a data line electrically connected to the source electrode, (vii) a patterned passivation layer, formed on the source electrode, the drain electrode and the data line, and exposing a portion of the drain electrode, and (viii) a transparent conductive layer having a pixel electrode formed on the patterned passivation layer and electrically connected to the drain electrode through a contact hole.

The shielding portion of the TFT array panel is substantially rectangular. The TFT array panel further includes a shielding line, disposed on the substrate and under the data line. The gate line, the shielding portion and the shielding line are formed as the same layer. The data line is disposed on the patterned semiconductor layer. In one embodiment, the patterned semiconductor layer, the source electrode, the drain electrode, and the data line are formed by using a half-tone mask or a gray-tone mask. The pixel electrode overlaps at least a portion of the gate line, thereby forming a storage capacitor. The gate electrode and the shielding portion are separated with a gap, which is less than 6 µm in width. The shielding portion is formed to have a width that is at least equal to the width of the source electrode.

In one embodiment, the patterned semiconductor layer has an intrinsic semiconductor layer that forms a doped semiconductor layer thereonafter implanting. The drain electrode is an elongated conductive bar with a first end, and an opposite, second end, and the source electrode is a "U" shaped conductive layer formed on the patterned semiconductor layer. The source electrode substantially surrounds the first end of the drain electrode to form a "U" shaped channel area.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention.

Wherever possible, the same reference numbers are used throughout the drawings to refer to the same or like elements of an embodiment, and wherein.

DETAILED DESCRIPTION OF THE INVENTION

Figure 1:
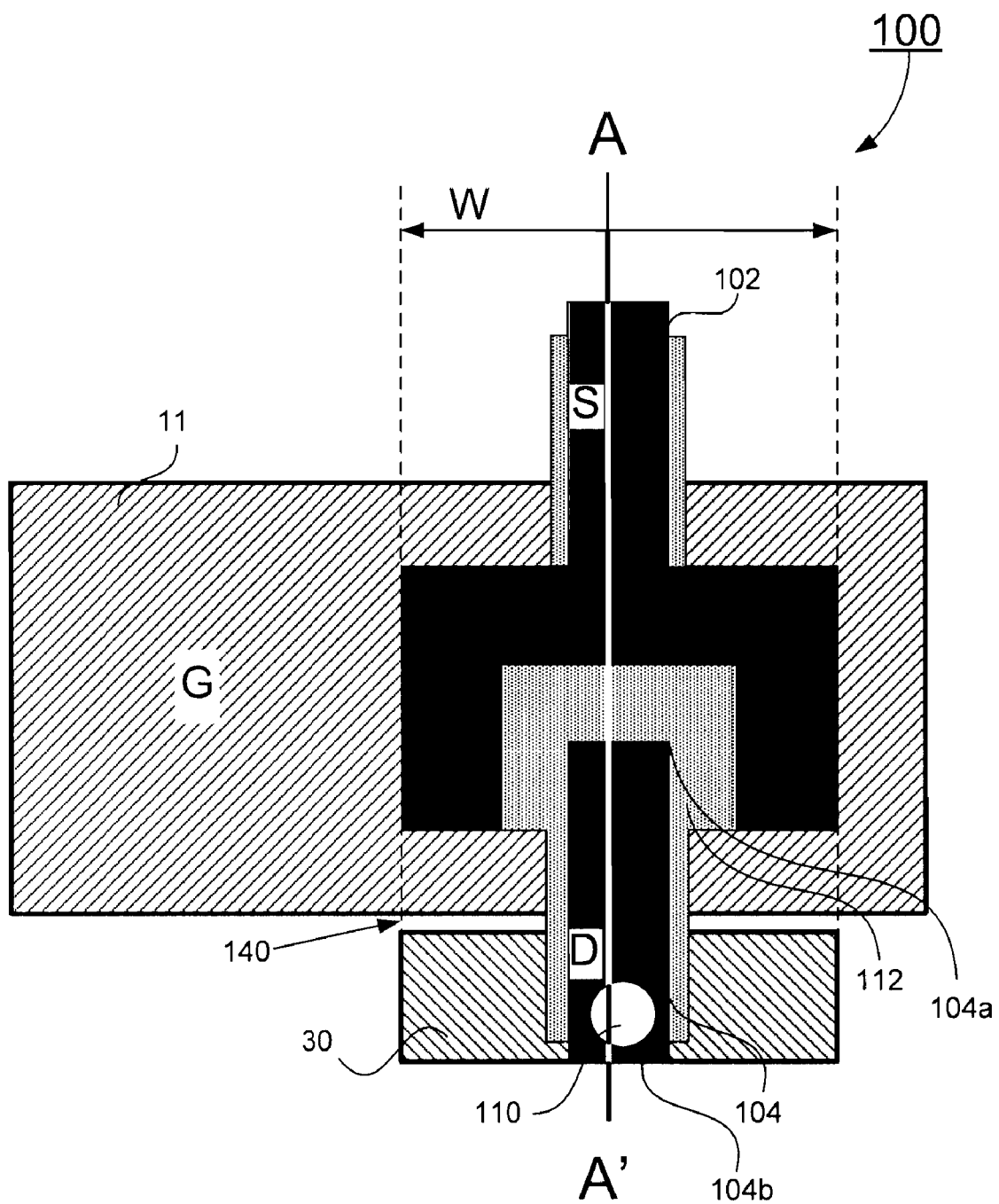
FIG. 1 shows a top view of a thin film transistor for a liquid crystal display with reduced photo leakage current according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings in FIGS. 1-7. In accordance with the purposes of this invention, as embodied and broadly described herein, this invention relates to a method to reduce photo leakage current of a thin film transistor for a liquid crystal display.

Figure 2:
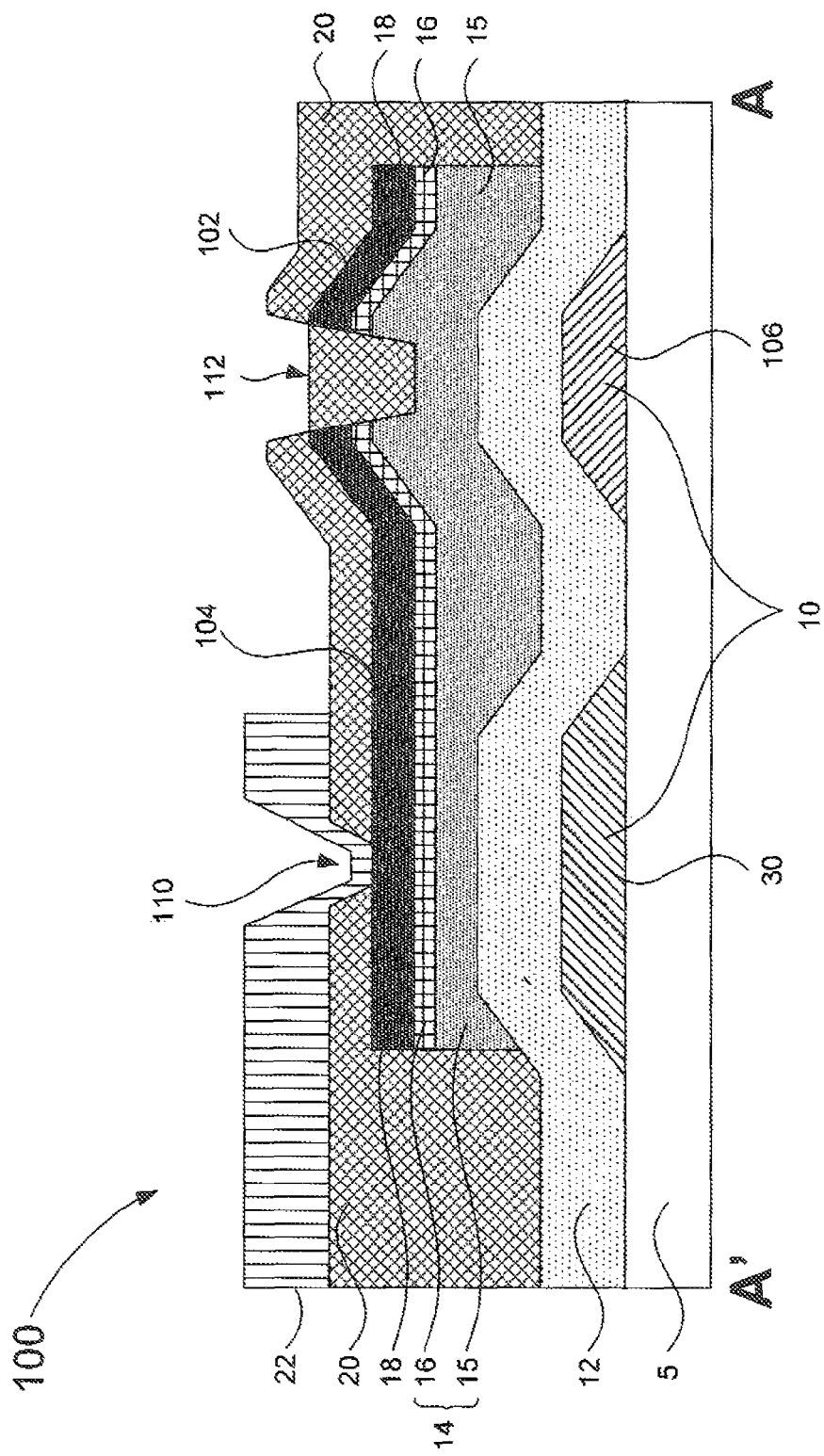
FIG. 2 shows a sectional view of a pixel structure for a liquid crystal display with reduced photo leakage current along the A-A' plane as shown in FIG. 1.

A top view of a thin film transistor (TFT) 100 for a liquid crystal display (LCD) with reduced photo leakage current is shown in FIG. 1 according to one embodiment of the present invention. FIG. 2 shows a sectional view of the TFT 100 along the A-A' plane shown in FIG. 1.

A plurality of TFTs 100 can be utilized to form a TFT array panel for an Liquid Crystal Display (LCD) device. The TFT array panel for a liquid crystal display device is formed with a plurality of pixel structure with thin film transistors arranged in a matrix form to support a plurality of LCD pixel display areas arranged correspondingly, and to form a larger display area having the plurality of LCD pixel display areas.

For each TFT of the TFT array panel, it has a substrate 5, and a patterned first conductive layer 10 having a gate line 11, a gate electrode 106, and a shielding portion 30, adjacent to the gate line 11, all formed on the substrate 5. Each TFT also has a gate insulating layer 12 formed on the patterned first conductive layer 10, a patterned semiconductor layer 14 formed on the gate insulating layer 12 over the gate electrode 106 and the shielding portion 30, a patterned second conductive layer 18 having a source electrode 102 and a drain electrode 104 disposed on the patterned semiconductor layer 14, and a data line 13 (shown in FIG. 4B) electrically connected to the source electrode 102. A patterned passivation layer 20 is formed on the source electrode 102, the drain electrode 104 and the data line 13 such that a portion of the drain electrode 104 is exposed. A patterned transparent conductive layer 22 having a pixel electrode 32 is formed on the patterned passivation layer 20 and electrically connected to the drain electrode 104 through a contact hole 110, which is defined by the patterned passivation layer 20.

The shielding portion 30 formed on the TFT substrate is substantially rectangular when viewed from the top as shown in FIG. 1. The gate line 11 and the shielding portion 30 are formed as parts of the patterned first conductive layer 10.

In one embodiment, the patterned first conductive layer 10 having the gate line 11, the gate electrode 106, and the shielding portion 30 is formed on the substrate 5. The patterned semiconductor layer 14 having the intrinsic semiconductor layer 15 and the doped semiconductor layer 16 is formed on the gate insulating layer 12 over the gate electrode 106 and the shielding portion 30. The data line 13 is disposed on the gate insulating layer 12.

Figure 4A:
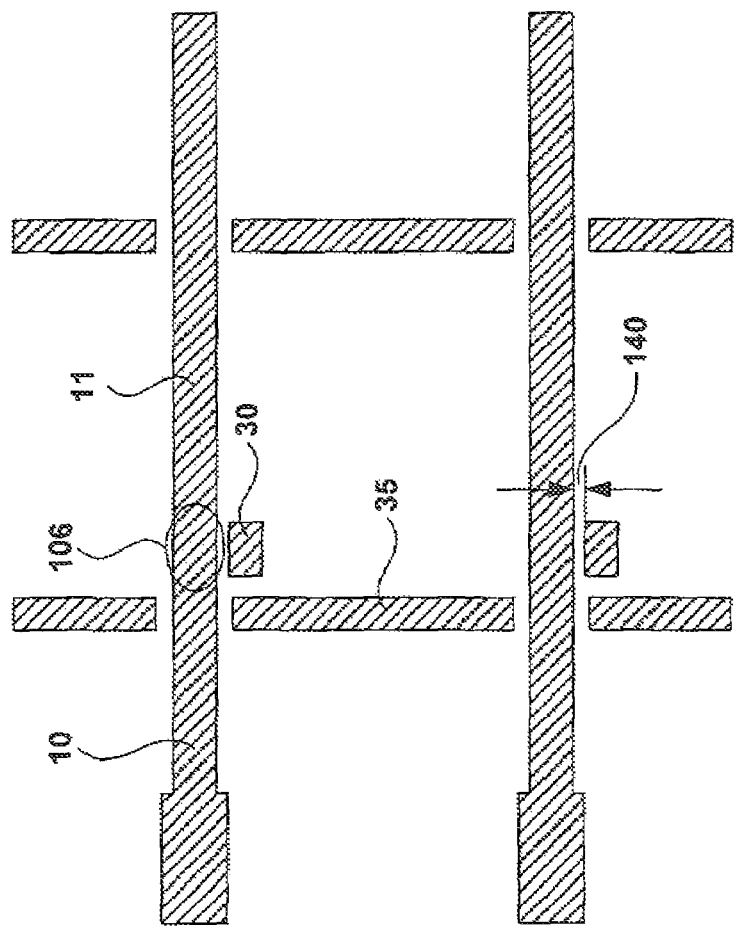
FIGS. 4A through 4D illustrate several steps of a manufacturing process of a thin film transistor array panel for a liquid crystal display with reduced photo leakage current according to another embodiment of the present invention
Figure 4B:
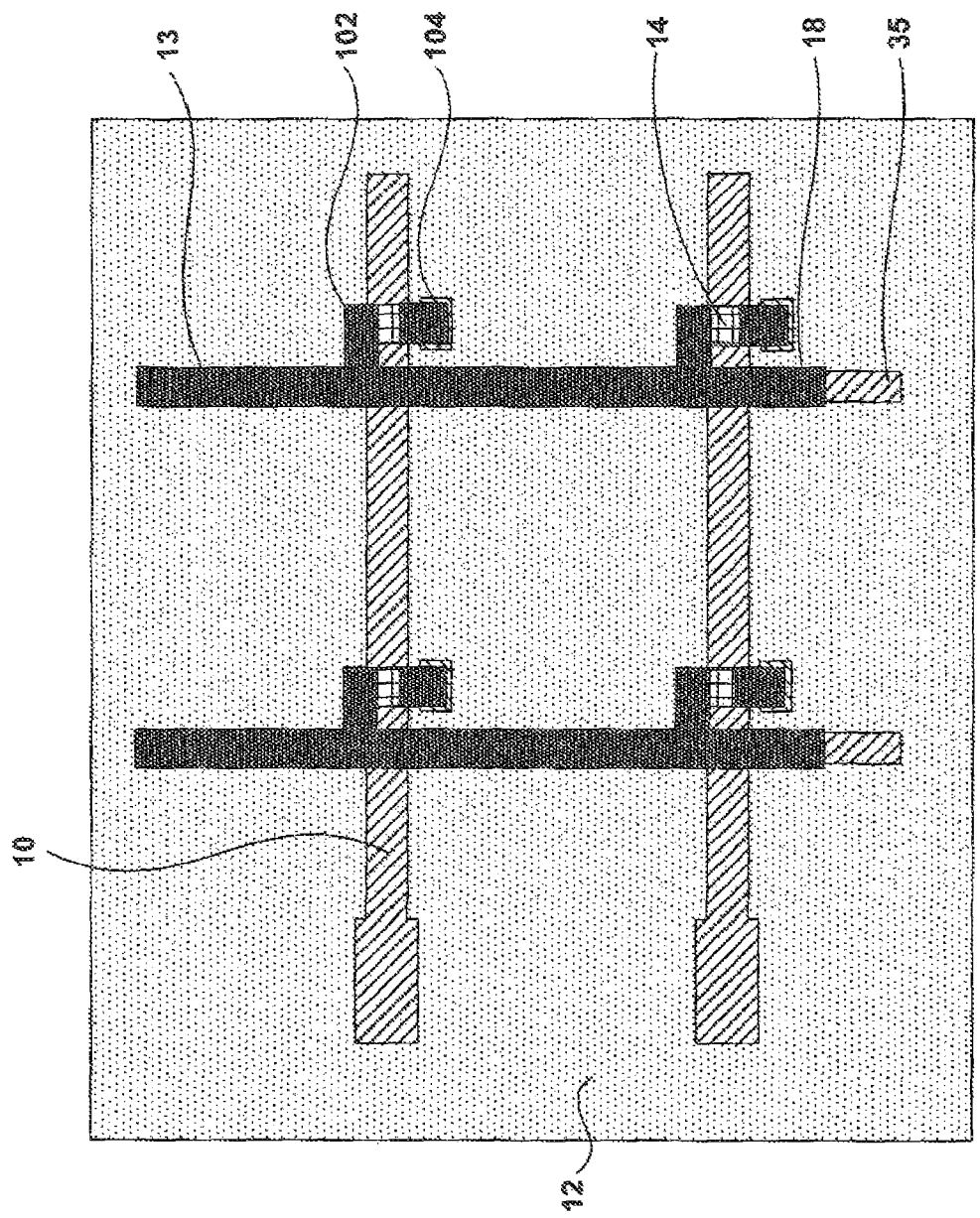

In another embodiment, the patterned first conductive layer 10 having the gate line 11, the gate electrode 106, the shielding portion 30, and a shielding line 35 is formed on the substrate 5, as shown in FIG. 4A. As shown in FIG. 4B, the patterned semiconductor layer 14 has an intrinsic semiconductor layer 15 and a doped semiconductor layer 16. The doped semiconductor layer 16 may be formed after the intrinsic semiconductor layer 15 is implanted. The data line 13 is disposed on the patterned semiconductor layer 14. The shielding line 35 is under the date line 13. The patterned semiconductor layer 14, and the data line 13 are formed by using a half-tone mask or a gray-tone mask.

Figure 3A:
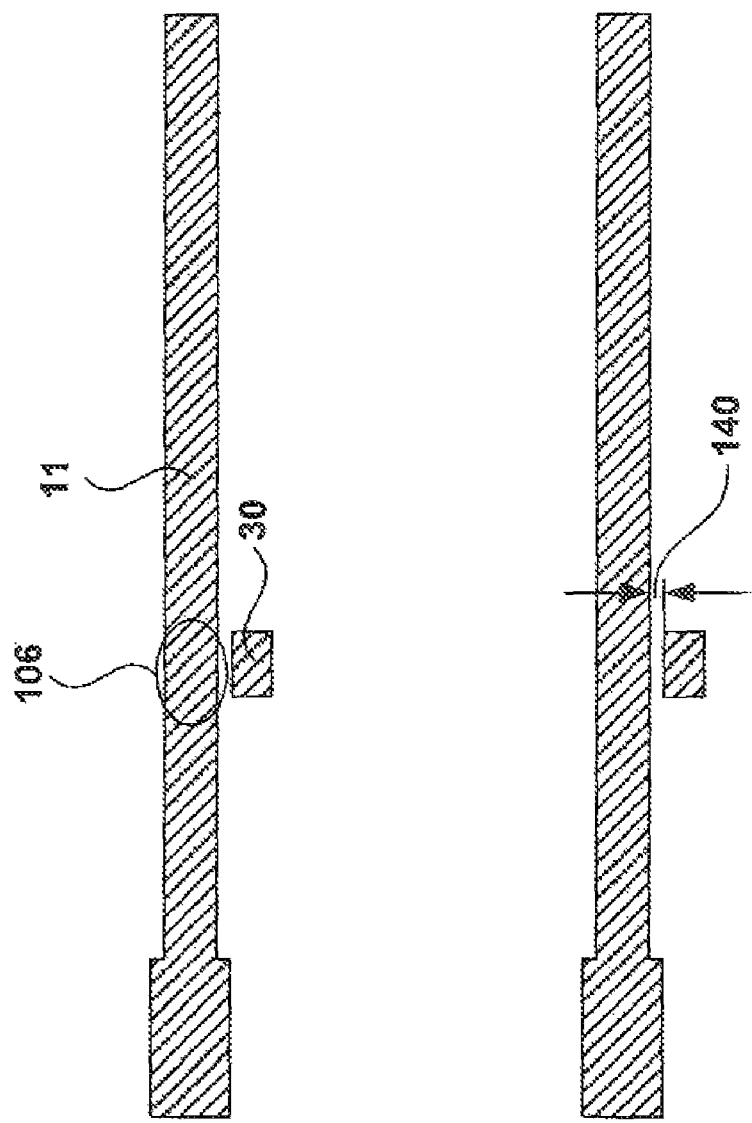
FIGS. 3A through 3E illustrate several steps of a manufacturing process of a thin film transistor array panel for a liquid crystal display with reduced photo leakage current according to one embodiment of the present invention.
Figure 3B:
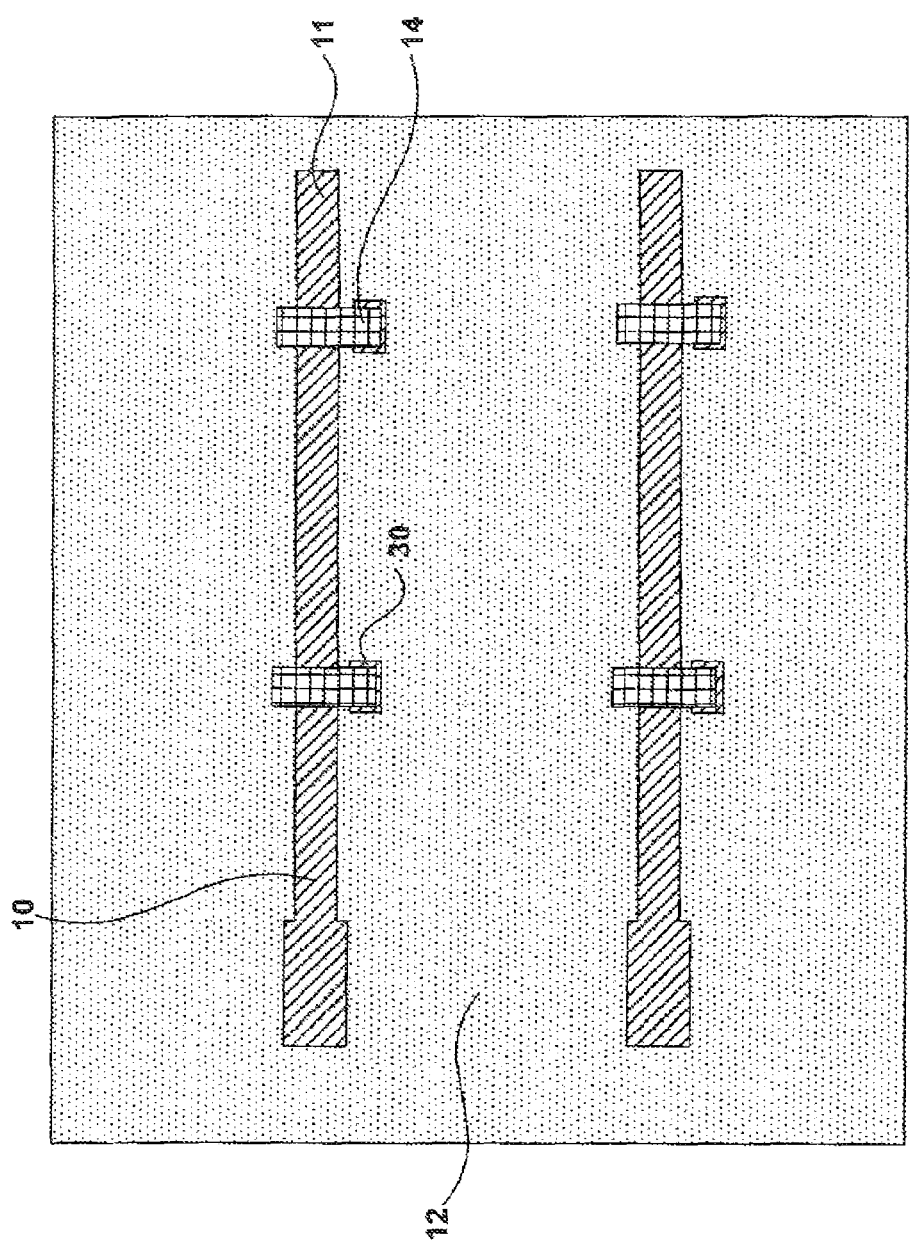
Figure 3C:
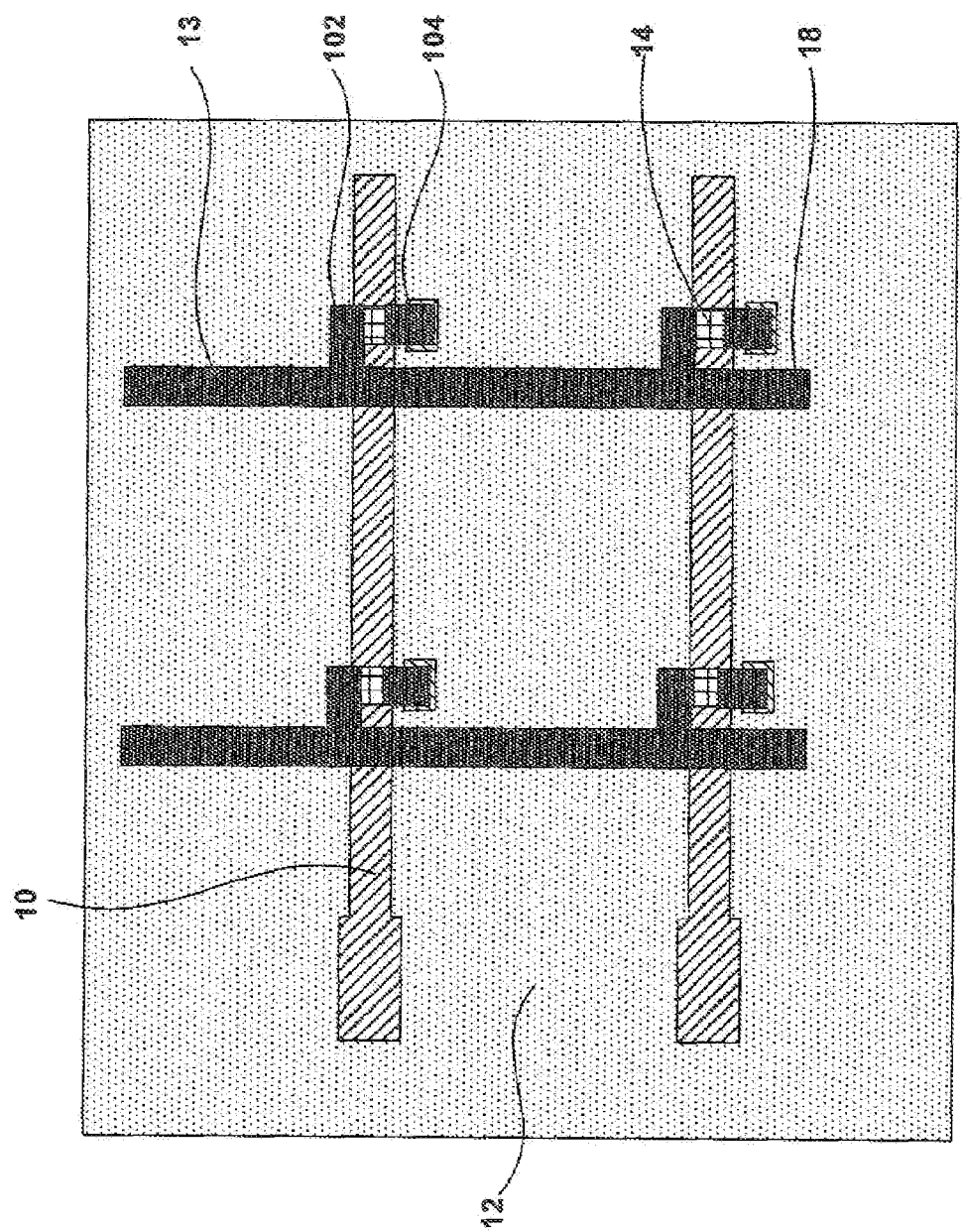
Figure 3D:
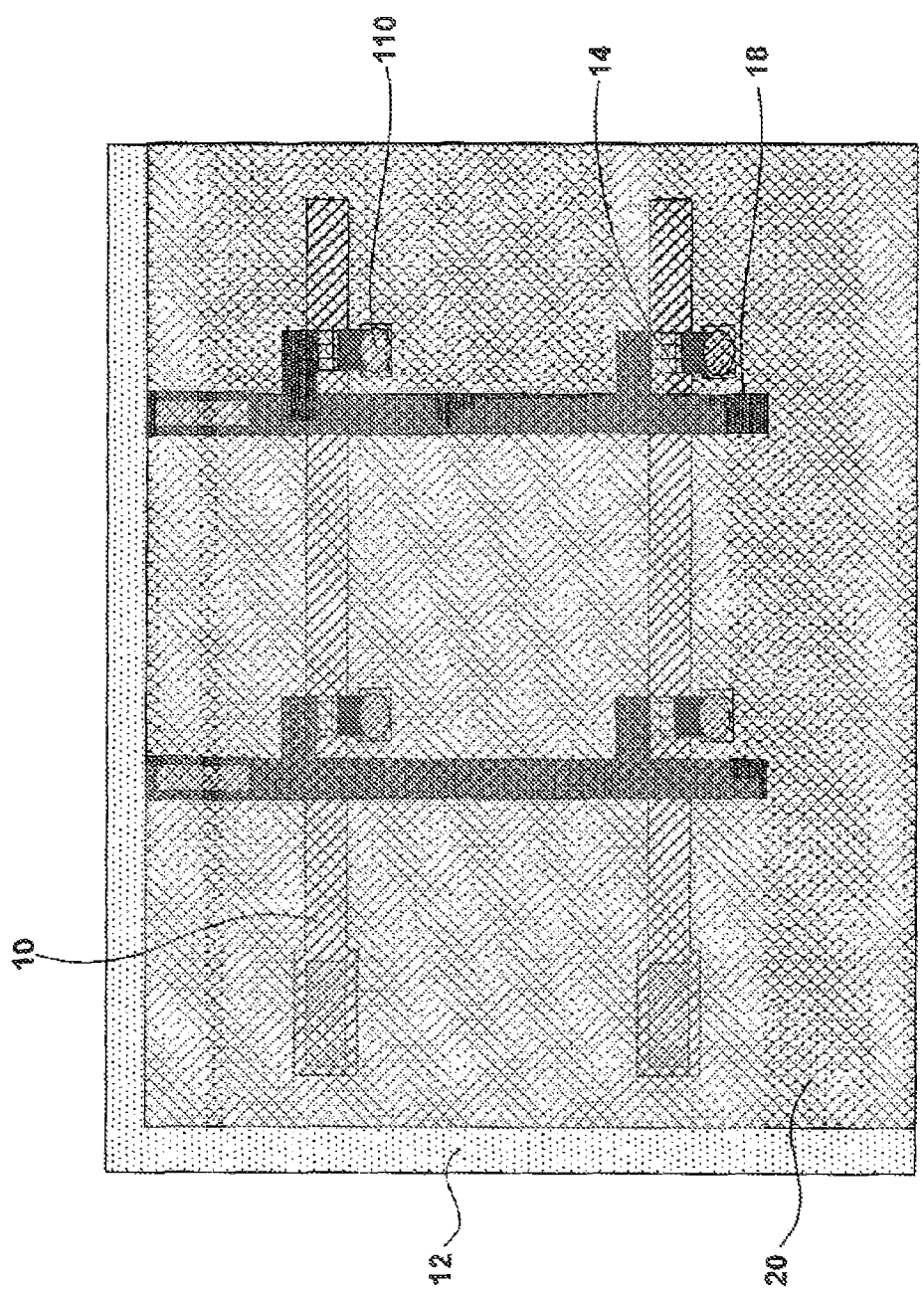
Figure 3E:
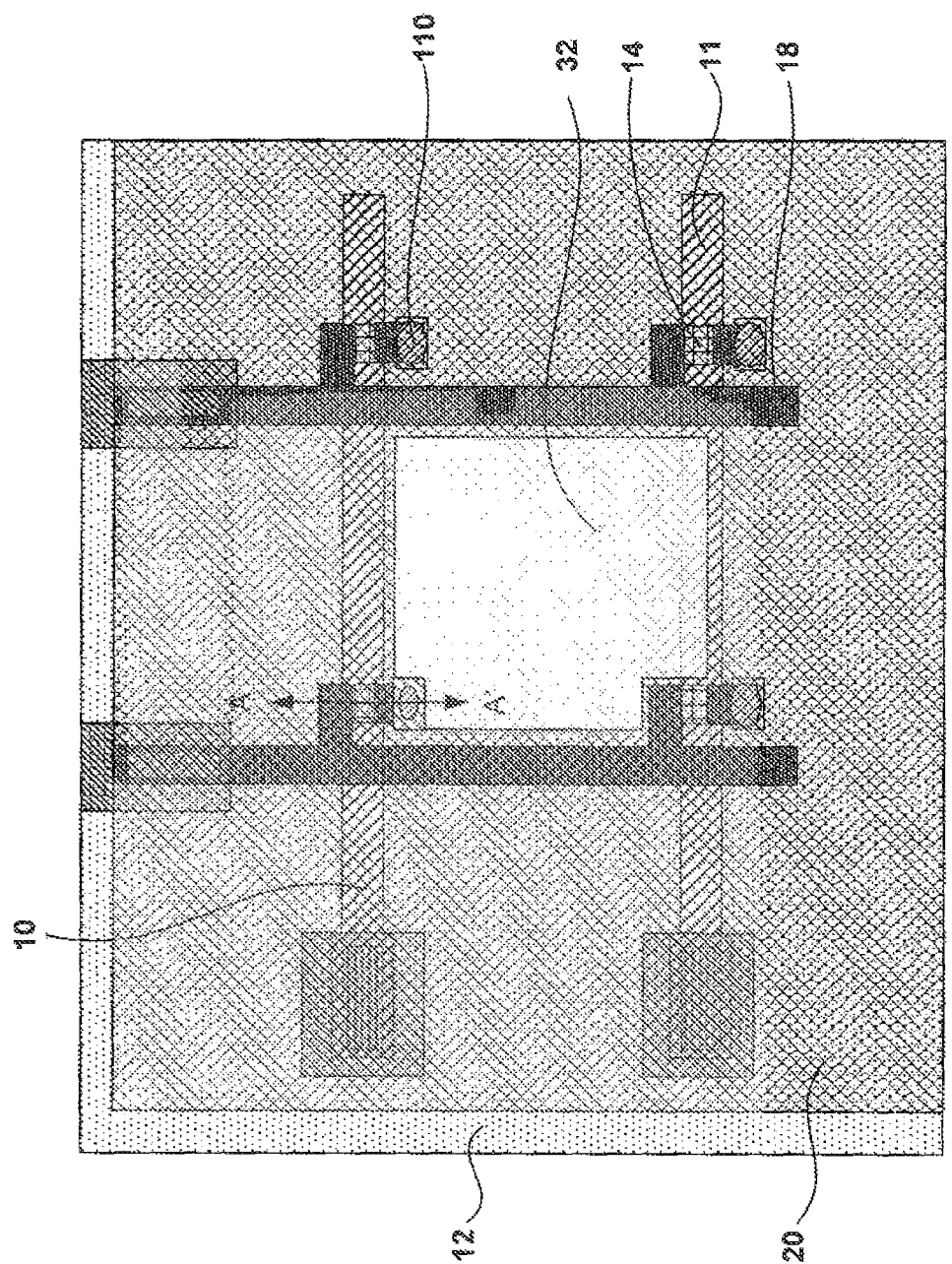

The pixel electrode 32, as shown in FIG. 3E, is formed as part of the patterned transparent conductive layer 22, which overlaps at least a portion of the gate line 11 to define a space therebetween, which is occupied by the gate insulating layer 12, thereby forming a storage capacitor. The gate electrode 106 and the shielding portion 30 are separated with a gap 140, which is less than 6 μm in width. The shielding portion 30 is formed to have a width that is at least equal to the width W of the source electrode 102 as shown in FIG. 1.

Referring now to FIG. 1, the drain electrode 104 is formed as an elongated conductive bar with a first end 104a, and an opposite, second end 104b, and the source electrode 102 is formed as a "U" shaped conductive layer that is formed on the patterned semiconductor layer 14. The source electrode 102 substantially surrounds the first end 104a of the drain electrode 104 to form a corresponding "U" shaped channel area 112. The transparent conductive layer 22 can be made of an Indium Tin Oxide (ITO) layer, an Indium Zinc Oxide (IZO) layer, or a combination of these materials.

A portion of the drain electrode 104 overlaps at least a portion of the patterned transparent conductive layer 22, as shown in FIG. 2. In the overlapped area, a contact through hole 110 is formed to allow a patterned second conductive layer 18, of which the drain electrode 104 is a part, to electrically coupled to the patterned transparent conductive layer 22. The patterned transparent conductive layer 22 forms a pixel display area. The pixel display area overlaps at least a portion of the patterned first conductive layer 10.

The present invention in another aspect relates to a method of manufacturing thin film transistor (TFT) array panel with reduced photo leakage current for a liquid crystal display panel. In one embodiment, the method of manufacturing thin film transistor (TFT) array panel with reduced photo leakage current for a liquid crystal display panel includes the steps of:

(i) forming a patterned first conductive layer 10, which includes a gate line 11, a gate electrode 106, and a shielding portion 30, on a substrate 5;

(ii) forming a gate insulating layer 12 on the patterned first conductive layer 10 and the substrate 5;

(iii) forming a patterned semiconductor layer 14 on the gate insulating layer 12;

(iv) forming a patterned second conductive layer 18, which includes a source electrode 102 and a drain electrode 104, on the patterned semiconductor layer 14, and a data line 13 that is electrically coupled to the source electrode 102;

(v) forming a patterned passivation layer 20 on the patterned second conductive layer 18 and the substrate 5; and (vi) forming a patterned transparent conductive layer 22 on the passivation layer 20.

These steps can be performed in the order as set forth above in one embodiment of the present invention. Alternatively, they may be performed in other orders as known to people skilled in the art.

FIGS. 3A through 3E illustrate several steps of a manufacturing process of a thin film transistor for a liquid crystal display with reduced photo leakage current according to one embodiment of the present invention. It is noted that although the process for manufacturing only one TFT is described here in the specification, one or more TFTs can be made in similar processes.

A first photo-resist pattern is used to form a patterned first conductive layer 10, which includes a gate line 11, a gate electrode 106, and a shielding portion 30 as shown in FIG. 3A. In operation, the first photo-resist pattern is positioned to overlap at least a portion of a pixel electrode (not shown in FIG. 3A). With the first photo-resist pattern, the gate line 11, the gate electrode 106, and the shielding portion 30 are formed by:

(i) depositing a first conductive layer on the substrate 5 using a Physical Vapor Deposition (PVD) process;

(ii) depositing a first photo-resist pattern on the first conductive layer;

(iii) etching the first conductive layer by using the first photo-resist pattern as a mask to form a gate line 11, a gate electrode 106, and a shielding portion 30 on the substrate 5, respectively; and (iv) removing the first photo-resist pattern on the gate line 11, the gate electrode 106, and the shielding portion 30.

Again, these steps can be performed in the order as set forth above, or in one or more alternative orders.

The etching process can be a dry etching process, a wet etching process, or a combination of both. The first conductive layer can be made of metal, metal oxide, or a combination of both. A gap 140 is formed between the gate electrode 106 and the shielding portion 30. The width of the shielding portion 30 formed to be at least equal to the width of the "U" shaped source electrode 102, as shown in FIG. 1.

FIG. 3B partially shows the steps for forming a patterned semiconductor layer 14 as shown in FIG. 2) by using a second photo-resist pattern:

forming a gate insulating layer 12 layer on the gate line 11, the gate electrode 106 and the shielding portion 30 using a first Plasma Enhanced Chemical Vapor Deposition (PECVD) process;

(ii) depositing a layer of intrinsic semiconductor (such as layer 15 shown in FIG. 2) on the gate insulating layer 12 using a second PECVD process;

(iii) depositing a layer of doped semiconductor layer 16 on the layer of intrinsic semiconductor using a third PECVD process;

(iv) depositing a second photo-resist pattern on the doped semiconductor layer 16;

(v) dry etching the doped semiconductor layer 16 and the intrinsic semiconductor layer by using the second photo-resist pattern as a mask to form the patterned semiconductor layer 14; and (vi) removing the second photo-resist pattern on the doped semiconductor layer 16.

Similarly, these steps can be performed in the order as set forth above, or in one or more alternative orders.

A third photo-resist pattern is used to form a patterned second conductive layer 18, which includes a data line 13, the source electrode 102, and the drain electrode 104, as shown in FIG. 3C. With the third photo-resist pattern, the data line 13, the source electrode 102, and the drain electrode 104 are formed according to several steps as follows:

(i) depositing a second conductive layer on the doped semiconductor layer 16 and the gate insulating layer 12 using a PVD process;

(ii) depositing a third photo-resist pattern on the second conductive layer;

(iii) etching the second conductive layer by using the third photo-resist pattern as a mask to form the data line 13, the source electrode 102 and the drain electrode 104; and (iv) removing the third photo-resist pattern on the data line 13, the source electrode 102 and the drain electrode 104.

Likewise, these steps can be performed in the order as set forth above, or in one or more alternative orders.

The etching process can be a dry etching process, a wet etching process, or a combination of both. The second conductive layer can be made of metal, metal oxide, or a combination of both.

A fourth photo-resist pattern is used to form a patterned passivation layer 20, as shown in FIG. 3D, according to several steps as follows:

(i) depositing a passivation layer on the data line 13, the source electrode 102 and the drain electrode 104 using a PECVD process;

(ii) depositing a fourth photo-resist pattern on the passivation layer;

(iii) etching the passivation layer by using the fourth photo-resist pattern as a mask to form a contact through hole 110 as shown in FIG. 2) as the contact between the transparent conductive layer 22 and the drain electrode 104; and (iv) removing the fourth photo-resist pattern.

Also, these steps can be performed in the order as set forth above, or in one or more alternative orders.

The etching process can be a dry etching process, a wet etching process, or a combination of both.

A fifth photo-resist pattern is used to form a patterned transparent conductive layer 22 having a pixel electrode 32, as shown in FIG. 3E, according to several steps as follows:

(i) depositing a transparent conductive layer on the patterned passivation layer 20 by using a PVD process;
(ii) depositing a fifth photo-resist pattern on the transparent conductive layer;
(iii) etching the transparent conductive layer by using the fifth photo-resist pattern as a mask to form the pixel electrode 32; and
(iv) removing the fifth photo-resist pattern on the pixel electrode 32.

The etching process can be a dry etching process, a wet etching process, or a combination of both. In one embodiment, the transparent conductive layer is an indium tin oxide (ITO) layer. In another embodiment, the transparent conductive layer is an indium zinc oxide (IZO) layer. In yet another embodiment, the transparent conductive layer 22 can be formed with a combination of both ITO and IZO.

FIGS. 4A through 4D illustrate several steps of a manufacturing process of a thin film transistor for a liquid crystal display with reduced photo leakage current according to another embodiment of the present invention. It is noted that although the process for manufacturing only one TFT is described here in the specification, one or more TFTs can be made in similar processes.

As shown in FIG. 4A, a first shielding pattern is used to form a patterned first conductive layer 10, which includes a gate line 11, a gate electrode 106, a shielding portion 30, and a shielding line 35. The steps can be performed as set forth above.

As shown in FIG. 4B, after the gate insulating layer 12 is formed on the first patterned conductive layer 10, the patterned semiconductor layer 14 and the patterned second conductive layer 18 are performed by using a half-tone mask or a gray-tone mask.

The patterned semiconductor layer 14 and the patterned second conductive layer 18 are formed according to several steps as follows:
(i) depositing a layer of intrinsic semiconductor 15 on the gate insulating layer 12;
(ii) depositing a layer of doped semiconductor layer 16 on the layer of intrinsic semiconductor 15;
(iii) depositing a second conductive layer on the layer of doped semiconductor layer 16;
(iv) forming a sixth photo-resist pattern by using the half-tone mask or the gray-tone mask, on the second conductive layer;
(v) etching the layer of intrinsic semiconductor 15, the layer of doped semiconductor layer 16, and the second conductive layer by using the sixth photo-resist pattern as a mask to form the patterned semiconductor layer 14 and the data line 13, the source electrode 102 and the drain electrode 104 on the patterned semiconductor layer; and
(vi) removing the sixth photo-resist pattern.

The shielding line 35 is disposed under the data line 13.

Figure 4C:
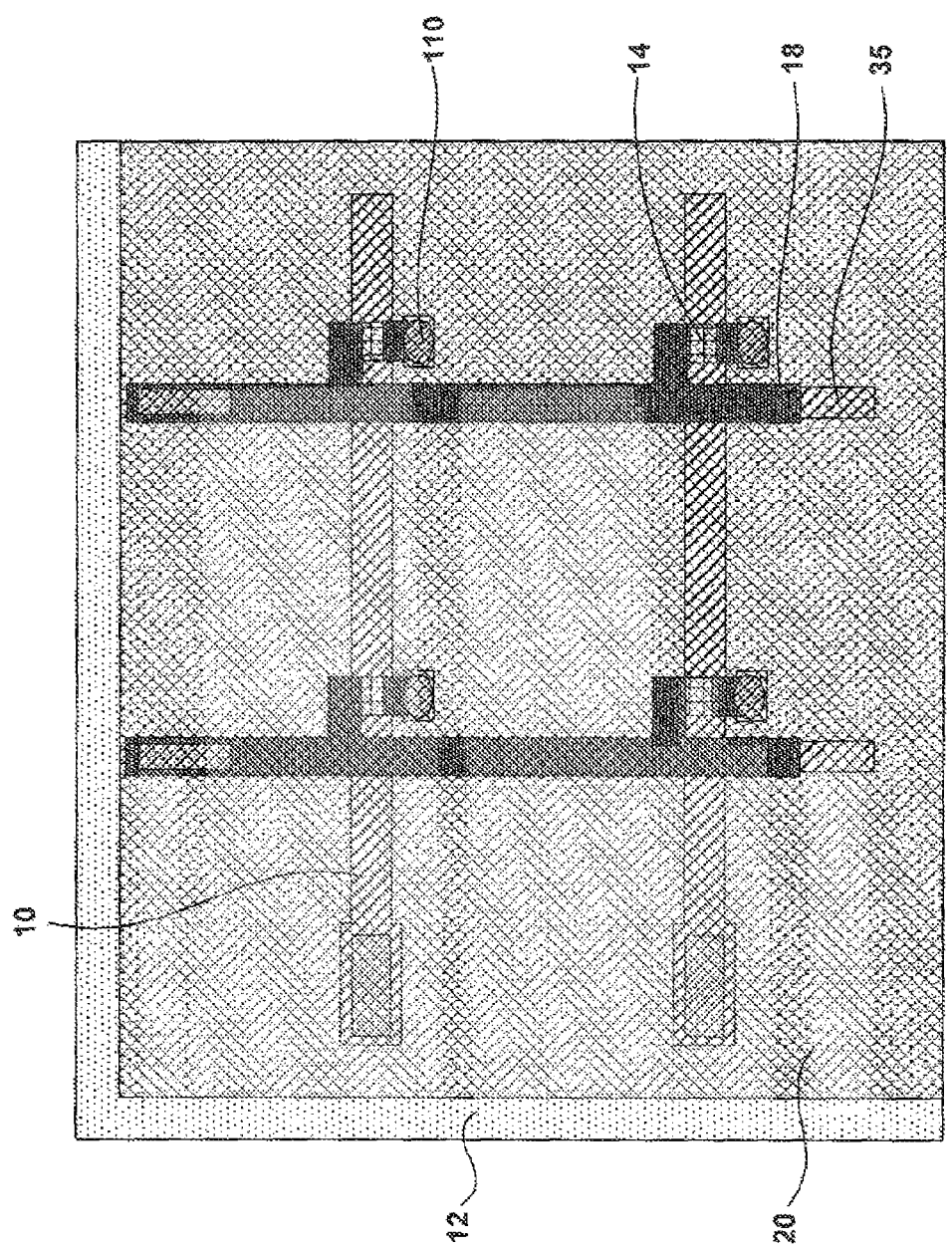
Figure 4D:
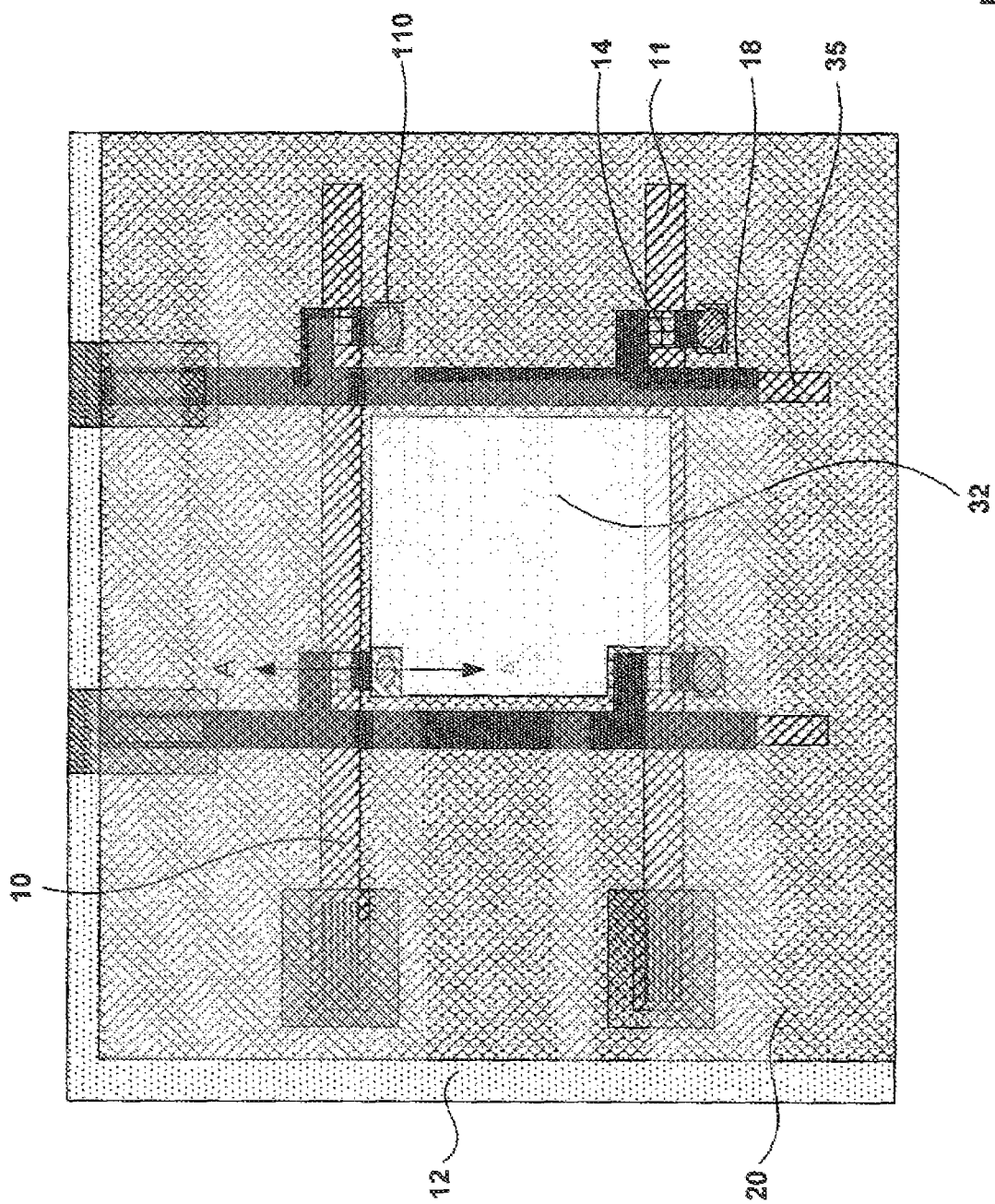
Figure 5A:
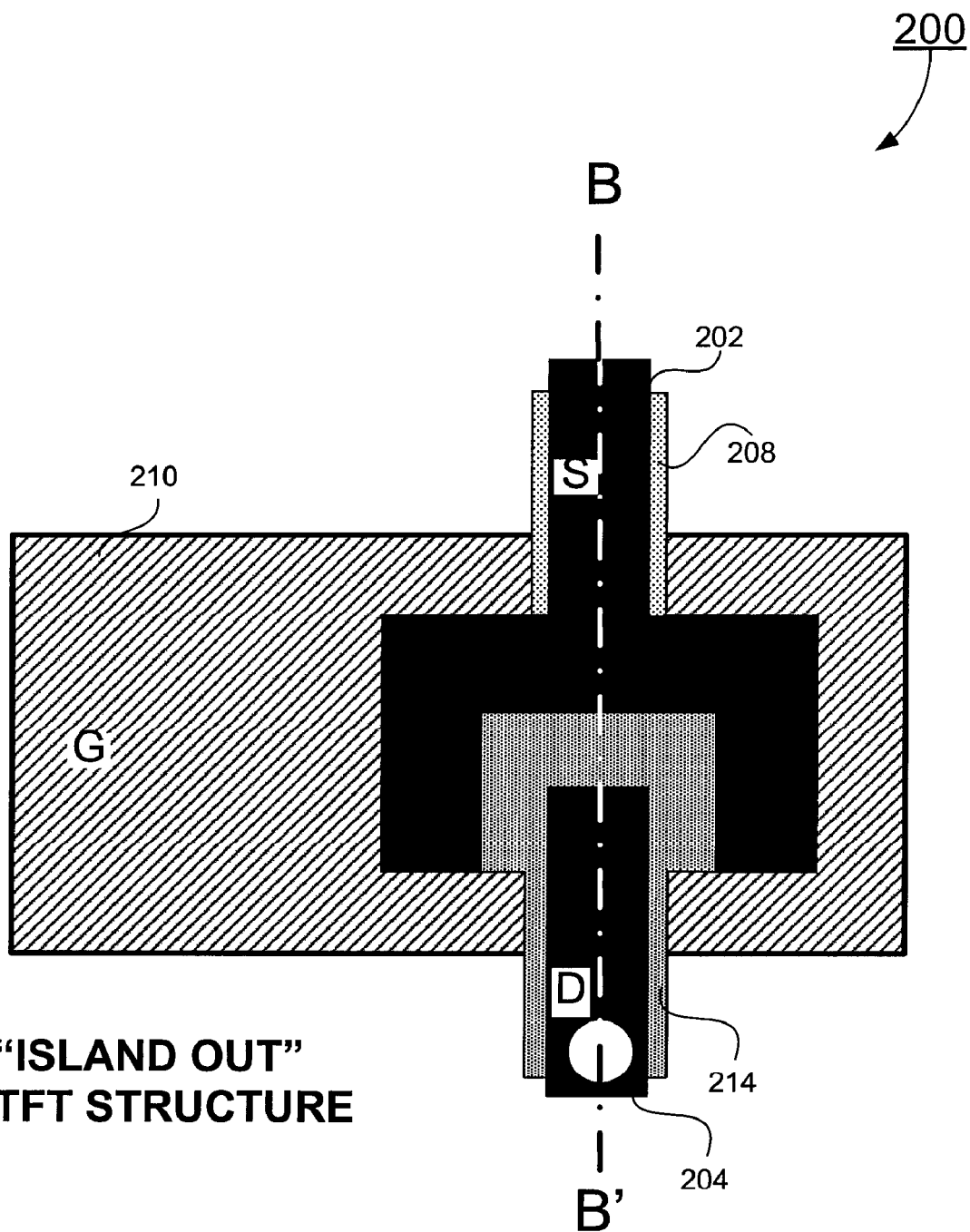
FIGS. 5A to 5C show a top view, a sectional view and a more detailed sectional view of a thin film transistor for a liquid crystal display with a conventional "island out" TFT structure, respectively.
Figure 5B:
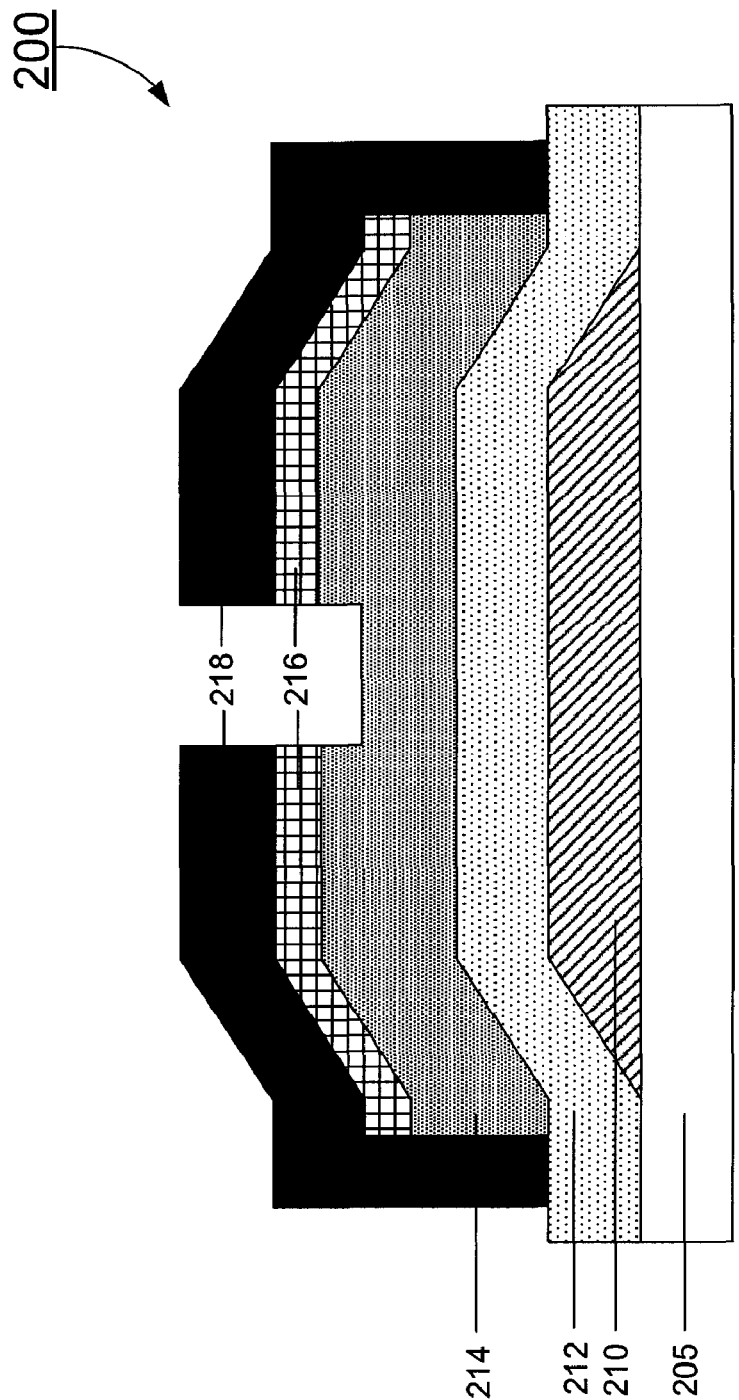
Figure 5C:
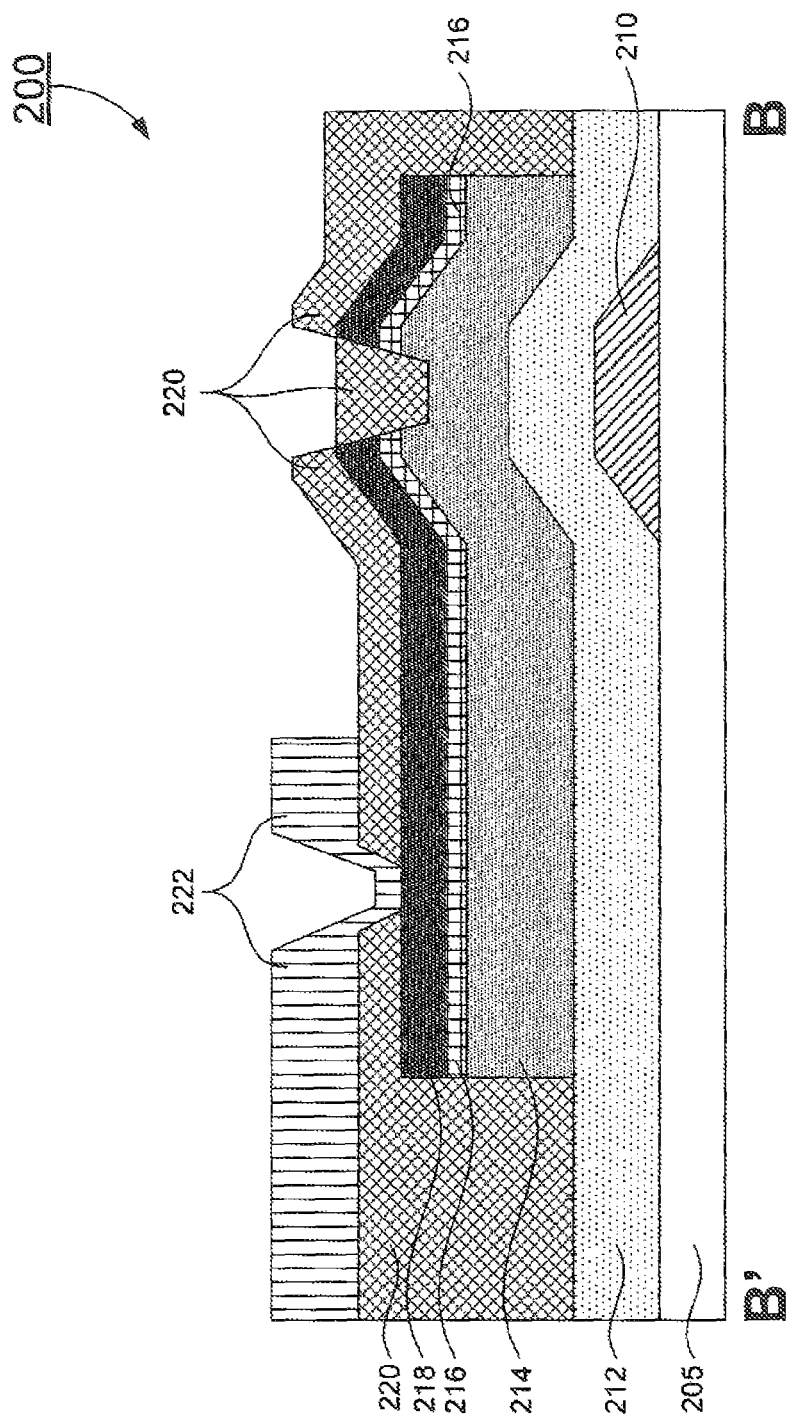
Figure 6A:
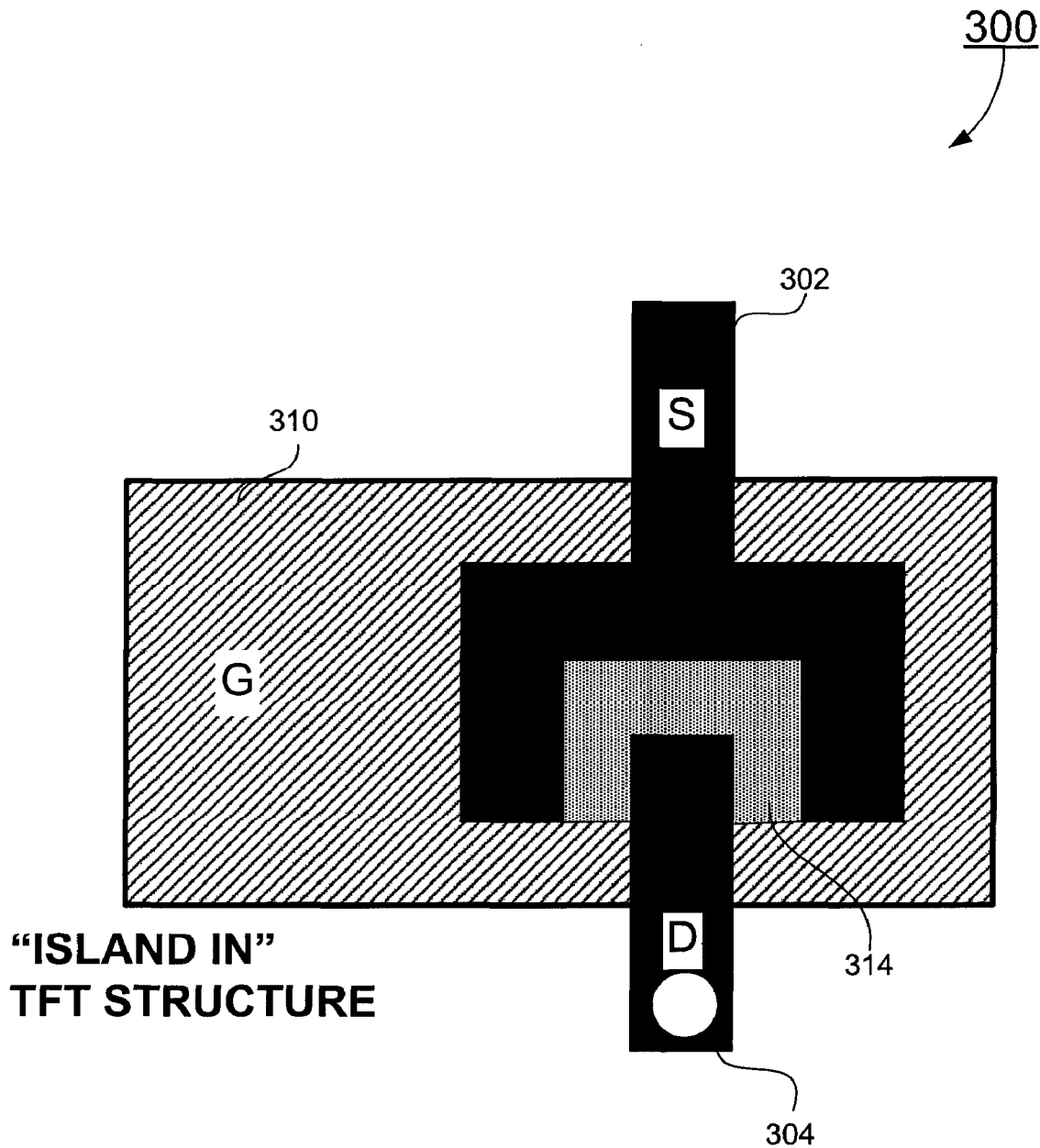
FIGS. 6A to 6B show a top view, a sectional view of a thin film transistor for a liquid crystal display with a conventional "island in" TFT structure, respectively.
Figure 6B:
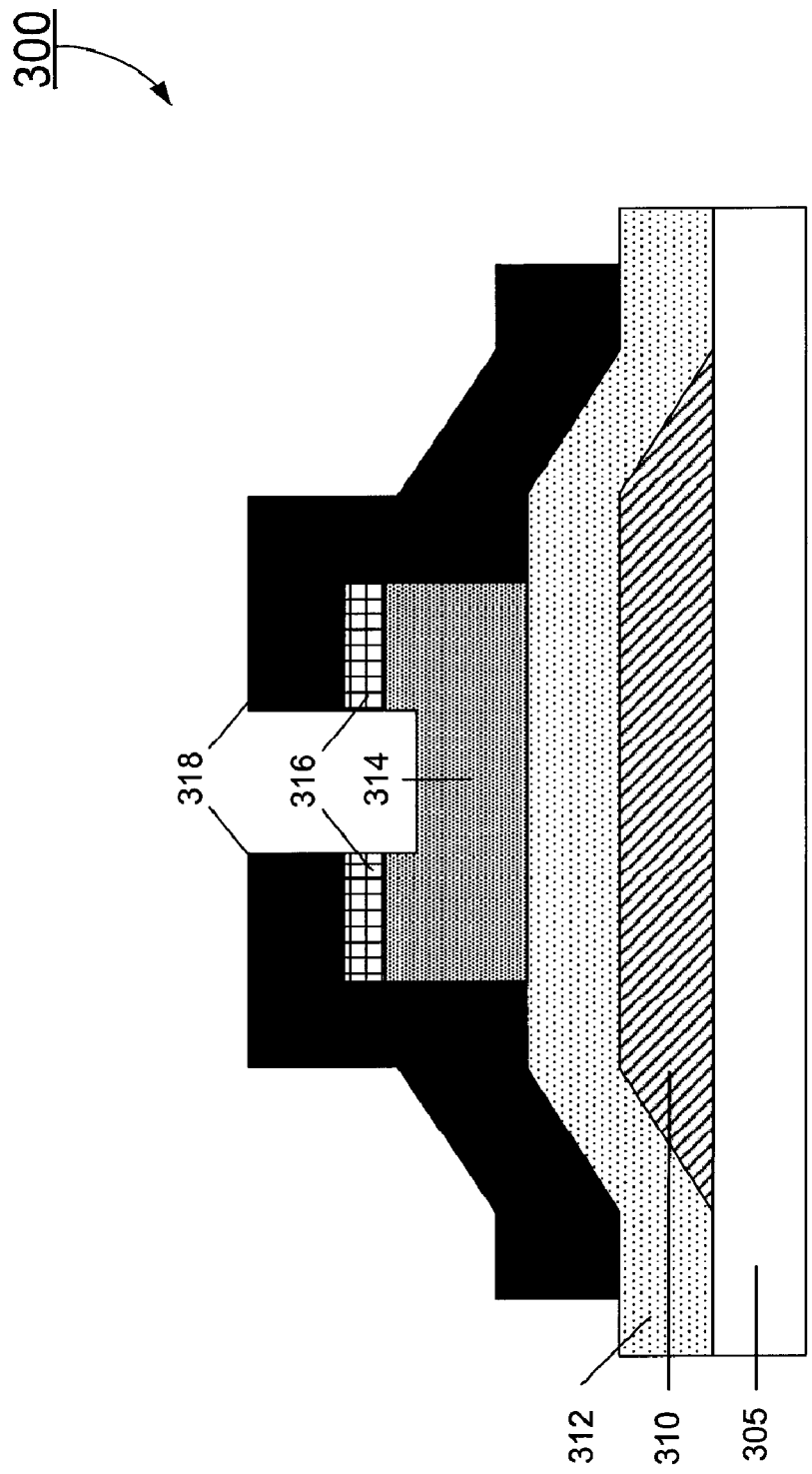

Next, a patterned passivation layer 20 and a patterned transparent conductive layer 22 having a pixel electrode 32 are formed, as shown in FIG. 4C and FIG. 4D. The steps can be performed as set forth above.

Figure 7:
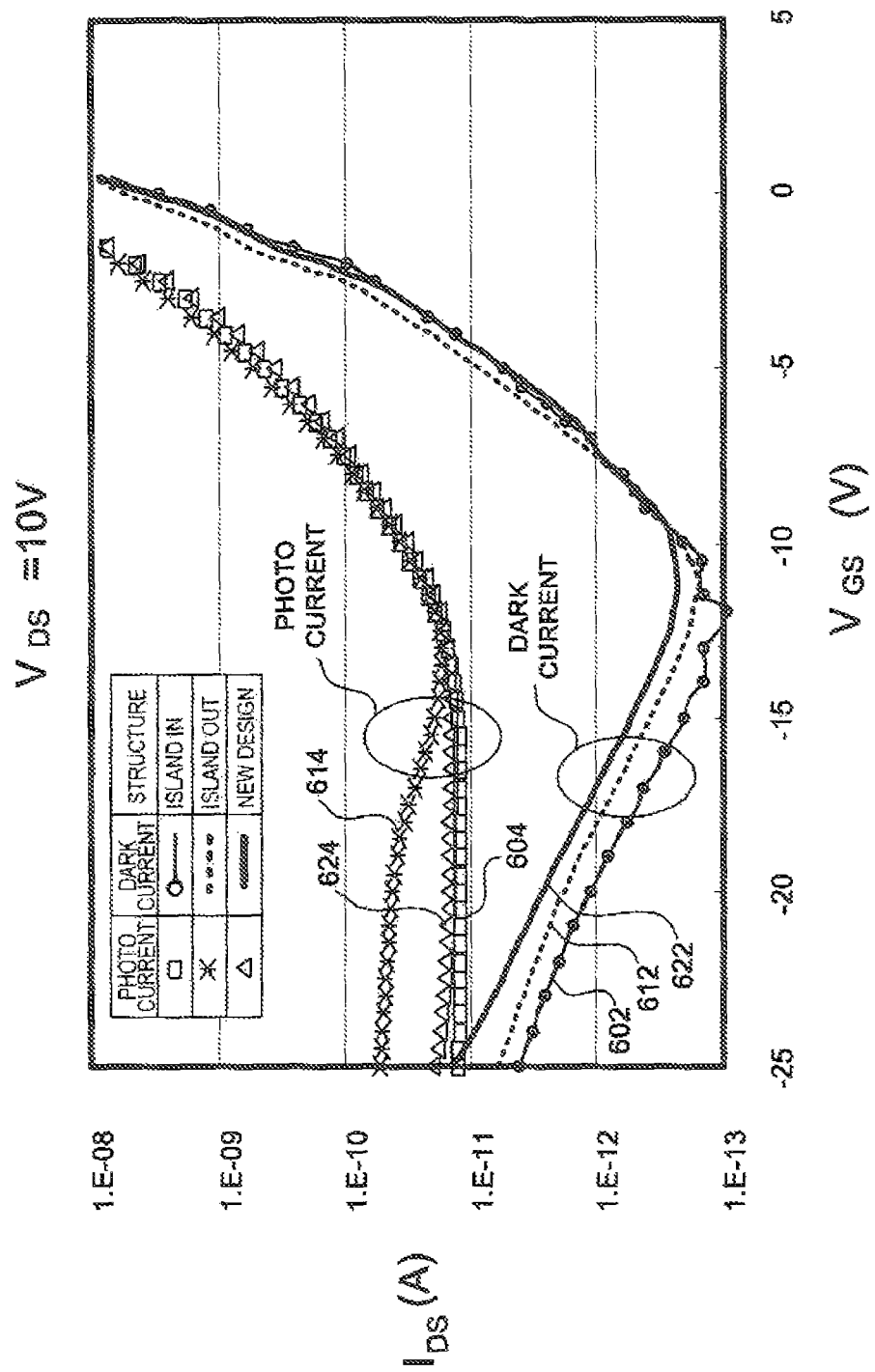
FIG. 7 displays a voltage vs. photo current curve and a voltage vs. dark current curve comparing TFTs manufactured in accordance with one embodiment of the present invention to the TFTs manufactured in accordance with conventional "island out" and "island in" TFT structures, where similar voltage is applied to the gates and sources of the corresponding thin film transistors to show a reduced photo leakage current in the TFTs according to embodiment of the present invention.

The TFT structure provided by the present invention represents a novel and significant technology advance over the current available TFT structures. FIG. 7 displays a voltage vs. photo current curve and a voltage vs. dark current curve comparing TFTs manufactured in accordance with one embodiment of the present invention to the TFTs manufactured in accordance with conventional "island out" and "island in" TFT structures, where similar voltage is applied to the gates and sources of the corresponding thin film transistors to show reduced photo leakage current the TFTs according to one embodiment of the present invention.

The dark current is a current passing through the drain electrode and the source electrode when there is not sufficient environmental lighting. The photo current is a current passing through the drain electrode and the source electrode when there is normal or strong environmental lighting. The voltage between the drain electrode and the source electrode is set to be at VDS=10V, in this example.

The curve 602 represents the dark current of a conventional TFT with an "island-in" structure. The curve 612 represents the dark current of a conventional TFT with an "island-out" structure. The curve 622 represents the dark current of a TFT according to one embodiment of the present invention. The curve 604 represents the photo current of the TFT with an "island-in" structure. The curve 614 represents the photo current of the TFT with an "island-out" structure. The curve 624 represents the photo current of the TFT according to one embodiment of the present invention. From FIG. 7, the dark current (curve 622) of the TFT of the present invention is slightly larger than the other two TFT structures, but it is still significantly smaller than any of photo currents 604, 614, and 624. However, the photo current 624 of the TFT according the present invention is significantly smaller than the photo current 614 of the "island-out" structure TFT, and almost identical to the photo current 604 of the "island-in" structure TFT. The comparisons of the photo currents among these three TFT types indicate that the present invention, among other things, provides a method to achieve the goal of reducing the photo-leakage-current with a simplified manufacturing process.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method of forming a thin film transistor (TFT) array panel, comprising:
   (i) forming a patterned first conductive layer, including a gate line and a shielding portion, on a substrate, the shielding portion being electrically floated;
   (ii) forming a gate insulating layer on the patterned first conductive layer and the substrate;
   (iii) forming a patterned semiconductor layer, including a portion that overlaps the shielding portion, on the gate insulating layer;
   (iv) forming a patterned second conductive layer, including a source electrode and a drain electrode on the patterned semiconductor layer, and a data line electrically connected to the source electrode, wherein the shielding portion is not overlapped with the data line;
   (v) forming a patterned passivation layer on the patterned second conductive layer and the substrate; and (vi) forming a patterned transparent conductive layer on the patterned passivation layer.

2. The method according to claim 1, wherein the step of forming the patterned first conductive layer further comprises the step of forming a gap between the gate line and the shielding portion.

3. The method according to claim 2, wherein the width of the gap is less than 6 μm.

4. The method according to claim 1, wherein the step of forming the patterned first conductive layer comprises the steps of:
(i) forming a first conductive layer on the substrate;
(ii) forming a photo-resist pattern on the first conductive layer;
(iii) etching the first conductive layer by using the photo-resist pattern as a mask to form the gate line and the shielding portion adjacent to the gate line on the substrate; and
(iv) removing the photo-resist pattern.

5. The method according to claim 1, wherein the step of forming the patterned semiconductor layer comprises the steps of:
(i) forming an intrinsic semiconductor layer on the gate insulating layer;
(ii) forming a doped semiconductor layer on the intrinsic semiconductor layer;
(iii) forming a photo-resist pattern on the doped semiconductor layer;
(iv) etching the intrinsic semiconductor layer and the doped semiconductor layer by using the photo-resist pattern as a mask to form the patterned semiconductor layer; and
(v) removing the photo-resist pattern.

6. The method according to claim 1, wherein the step of forming the patterned second conductive layer comprises the steps of:
(i) forming a second conductive layer on the doped semiconductor layer and the gate insulating layer;
(ii) forming a photo-resist pattern on the second conductive layer;
(iii) etching the second conductive layer by using the photo-resist pattern as a mask to form the source electrode and the drain electrode on the doped semiconductor layer, and the data line on the gate insulating layer; and
(iv) removing the photo-resist pattern.

7. The method according to claim 1, wherein the step of forming the patterned passivation layer comprises the steps of:
(i) forming a passivation layer on the patterned second conductive layer and the substrate;
(ii) forming a photo-resist pattern on the passivation layer;
(iii) etching the passivation layer by using the photo-resist pattern as a mask to form a contact hole exposing a portion of the drain electrode; and
(iv) removing the photo-resist pattern.

8. The method according to claim 7, wherein the step of forming the patterned transparent conductive layer comprises the step of:
(i) forming a transparent conductive layer on the patterned passivation layer;
(ii) forming an additional photo-resist pattern on the transparent conductive layer;
(iii) etching the transparent conductive layer by using the additional photo-resist pattern as a mask to form the patterned transparent conductive layer electrically connected to the drain electrode through the contact hole; and
(iv) removing the additional photo-resist pattern.

9. The method according to claim 1, wherein the step of forming the patterned first conductive layer further includes forming a shielding line, disposed under the data line.

10. The method according to claim 9, wherein the steps of forming the patterned semiconductor layer, and forming the patterned second conductive layer are performed by using a half-tone mask or a gray-tone mask.

11. The method according to claim 10, wherein the steps of forming the patterned semiconductor layer and forming the patterned second conductive layer comprise the steps of:
(i) forming an intrinsic semiconductor layer on the gate insulating layer;
(ii) forming a doped semiconductor layer on the intrinsic semiconductor layer;
(iii) forming a second conductive layer on the doped semiconductor layer;
(iv) forming a photo-resist pattern by using the half-tone mask or the gray-tone mask, on the second conductive layer;
(v) etching the intrinsic semiconductor layer, the doped semiconductor layer, and the second conductive layer by using the photo-resist pattern as a mask to form the patterned semiconductor layer, and the patterned second conductive layer on the patterned semiconductor layer; and
(vi) removing the photo-resist pattern.

12. The method according to claim 1, further comprising the step of forming a storage capacitor between the gate line and the patterned transparent conductive layer.

13. The method according to claim 1, wherein the shielding portion is formed to have a width that is at least equal to the width of the source electrode.

14. A thin film transistor array panel formed according to the method of claim 1.

* * * * *